United States Patent [19]
Schuegraf

[11] Patent Number: 5,886,392
[45] Date of Patent: Mar. 23, 1999

[54] ONE-TIME PROGRAMMABLE ELEMENT HAVING CONTROLLED PROGRAMMED STATE RESISTANCE

[75] Inventor: Klaus F. Schuegraf, Boise, Id.

[73] Assignee: Micron Technology, Inc., Boise, Id.

[21] Appl. No.: 694,168

[22] Filed: Aug. 8, 1996

[51] Int. Cl.⁶ .................................................. H01L 27/13
[52] U.S. Cl. ............................................ 257/530; 257/50
[58] Field of Search .............................. 257/50, 530, 528, 257/529

[56] References Cited

U.S. PATENT DOCUMENTS

| | | | |
|---|---|---|---|
| 5,110,754 | 5/1992 | Lowrey et al. | 437/52 |
| 5,241,496 | 8/1993 | Lowrey et al. | 365/96 |
| 5,381,034 | 1/1995 | Thrower et al. | 257/530 |
| 5,498,886 | 3/1996 | Hsu et al. | 257/530 |
| 5,682,049 | 10/1997 | Nguyen | 257/530 |

*Primary Examiner*—David B. Hardy
*Attorney, Agent, or Firm*—Seed and Berry LLP

[57] ABSTRACT

A one-time non-conductive programmable element which is programmable to conduct current is provided. The programmable element comprises several anti-fuses connected in parallel with each other. According to one embodiment of the present invention, each anti-fuse of the programmable element includes first and second conductive plates and a dielectric layer between the two conductive plates. The first conductive plates of all anti-fuses are connected to each other and the second conductive plates of the anti-fuses are connected to each other to form the programmable element of the present invention. The programmable element provides a larger total surface area of the dielectric layer through several anti-fuses that are connected in parallel with each other. During programming, the larger surface area substantially improves the likelihood of capturing a higher defect area of the dielectric layer than was previously possible and allows the formation of strong electrical contact between the two plates having a programmed state resistance that can be controlled with relative accuracy.

13 Claims, 9 Drawing Sheets

# ONE-TIME PROGRAMMABLE ELEMENT HAVING CONTROLLED PROGRAMMED STATE RESISTANCE

TECHNICAL FIELD

This invention relates to semiconductor devices, and more particularly, to a one-time programmable anti-fuse element formed in integrated circuit devices and having a programmed state resistance that can be relatively accurately controlled.

BACKGROUND OF THE INVENTION

A one-time programmable anti-fuse is generally formed by a pair of conductive plates and a thin dielectric layer disposed between the conductive plates. In an unprogrammed state, the anti-fuse acts as an open circuit due to the dielectric layer and typically has a resistance of greater than 1 mega-ohm. To program the anti-fuse, a relatively high voltage pulse is applied across the two conductive plates. The high voltage causes the dielectric layer to break down thereby allowing the two plates to contact each other. Thus, in a programmed state, the anti-fuse acts as a closed circuit. Typically, the resistance of a programmed anti-fuse is less than 100 kilo-ohms.

Anti-fuses are used in integrated circuits (ICs) for a variety of purposes. One use is in the area of post package repair of ICs such as dynamic random access memory and field programmable gate array chips. During testing, non-functional circuit elements are replaced with redundant circuit elements. The replacement is done by programming an appropriate anti-fuse that provides an electrical connection to the redundant circuit element. The anti-fuses are also used as memory elements in programmable logic devices and read only memory devices.

One disadvantage of conventional anti-fuses is the difficulty of controlling the programmed state resistance. For example, one programmed anti-fuse may have a resistance of 50 ohm while another programmed anti-fuse may have a resistance in the range of 10 to 100 kilo-ohms. Another disadvantage of the conventional anti-fuses is the instability of the programmed state resistance. Specifically, the resistance of the programmed anti-fuses tends to increase over time. In the worst case, the programmed anti-fuse may actually switch from the programmed state to the unprogrammed state resulting in a circuit failure.

Therefore, it is desirable to provide a one-time programmable element that allows tighter control over variations in the programmed state resistance and better stability in the programmed state resistance over time.

SUMMARY OF THE INVENTION

According to the principles of the present invention, a one-time non-conductive programmable element comprises several anti-fuses connected in parallel with each other. According to one embodiment of the present invention, each anti-fuse of the programmable element includes first and second conductive plates and a dielectric layer between the two conductive plates. The first conductive plates of all anti-fuses are connected to each other and the second conductive plates of the anti-fuses are connected to each other to form the programmable element of the present invention. While there is no limit as to how many anti-fuses may be connected in parallel, the programmable element of the present invention preferably has 4 to 16 anti-fuses depending on the desired programmed state resistance. Significantly, the programmed state resistance of multiple, parallel-connected anti-fuses is not only more consistent than the programmed resistance of a single anti-fuse, but it is also lower than the programmed state resistance of a single anti-fuse covering the same surface area.

DETAILED DESCRIPTION OF THE INVENTION

Figure 1:
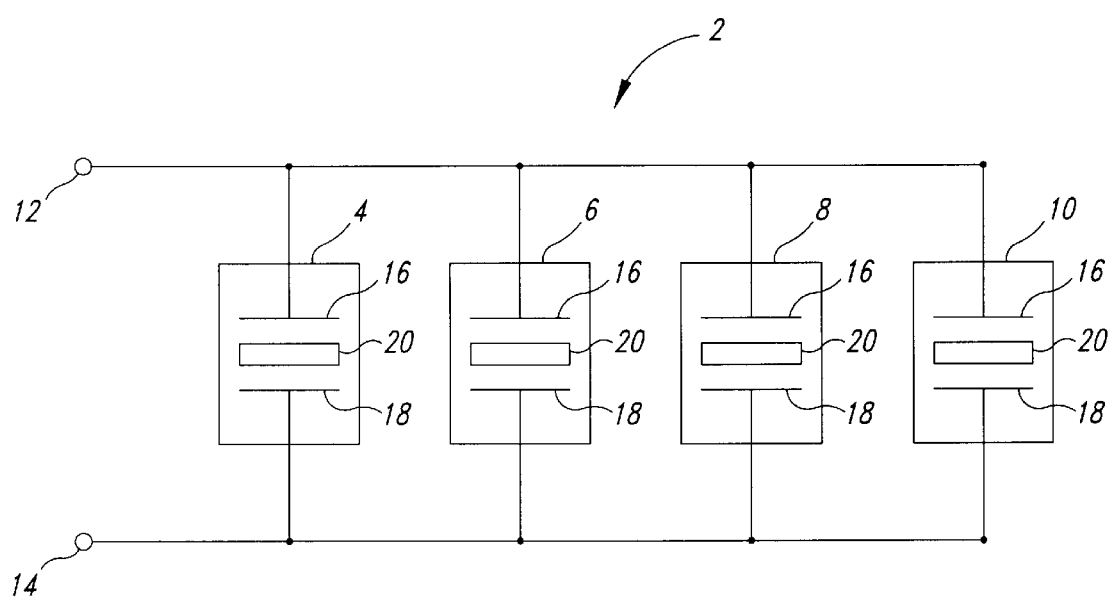
FIG. 1 is a schematic representation of a one-time programmable element according to one embodiment of the present invention.

As shown in FIG. 1, a one-time programmable element 2 according to one embodiment of the present invention includes four anti-fuses 4–10 connected in parallel with each other. Each anti-fuse includes a pair of conductive plates 16 and 18 and a dielectric layer 20 between the plates. The conductive plates may be doped silicon, polysilicon or metal. The dielectric layers may be oxide, nitride, nitride-oxide, oxide-nitride-oxide, undoped amorphous silicon, or the like. In an unprogrammed state, the programmable element 2 is non-conductive and has a resistance of over 1 mega-ohm across the terminals 12 and 14. To program the programmable element 2, a relatively high voltage pulse is applied across the terminals 12 and 14. The high voltage pulse causes a portion of the dielectric layer 20 of at least one anti-fuse to break down and melt, and the two plates of that anti-fuse contact each other to create a resistive short. In contrast to the conventional programmable elements whose programmed state resistance may be as high as several hundred kilo-ohm, the programmable element 2 according to the present invention has a programmed state resistance of less than 20 kilo-ohms across the terminals 12 and 14, as will be explained herein below.

Essentially, the breakdown of the dielectric layer 20 occurs at an area in which the composition of the dielectric material is most defective. The programmable element 2 achieves the lower programmed state resistance by providing a larger total surface area of the dielectric layer 20 through several anti-fuses 4–10 that are connected in parallel with each other. During programming, the larger surface area substantially improves the likelihood of capturing a higher defect area than was previously possible. This appears to provide higher electrical energy at the breakdown area and cause a longer and hotter melt of the dielectric layer 20. Consequently, the programmable element according to the present invention allows lower programmed state resistance and tighter control over variations in the programmed state resistance. Furthermore, the programmed state resistance of several anti-fuses connected in parallel is significantly lower than the programmed state resistance of a single anti-fuse having the same surface area. The present invention also provides improved stability in the programmed state resistance over time due to the formation of stronger electrical contact between the two plates near the breakdown area.

Figure 2:
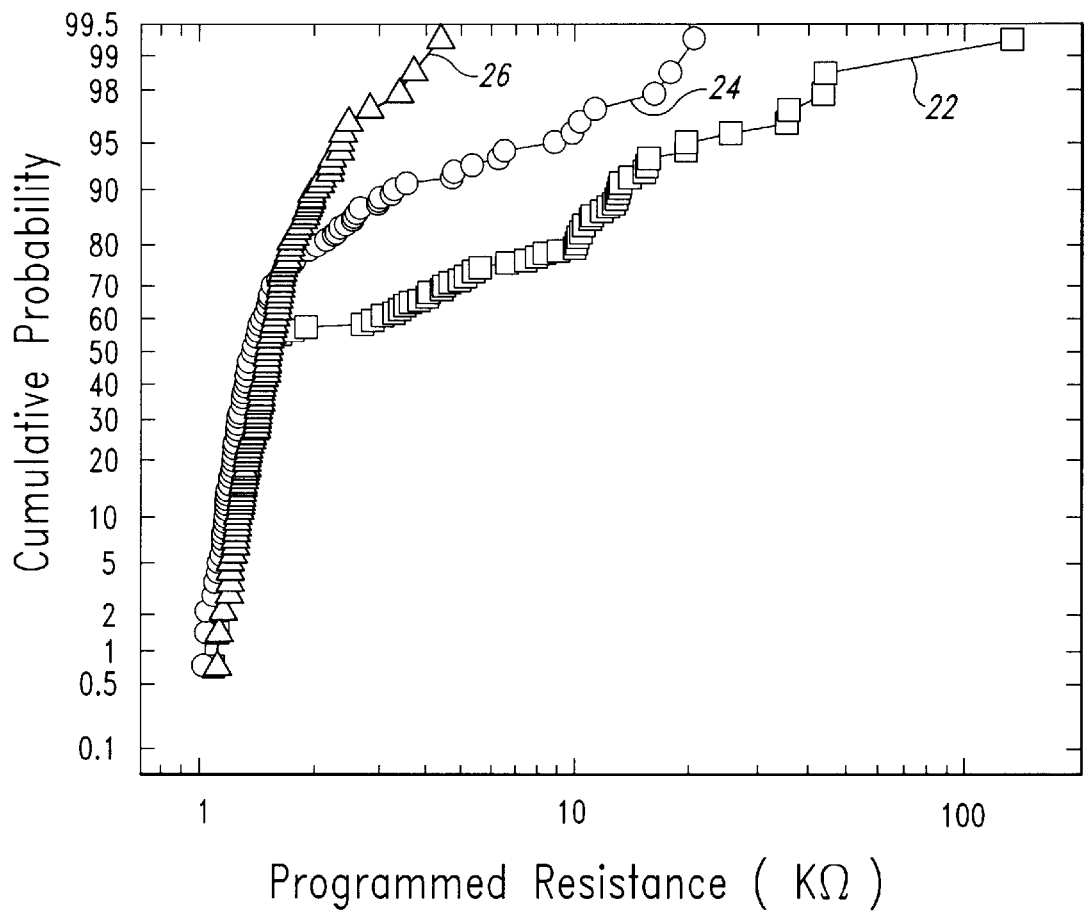
FIG. 2 is a graph illustrating the cumulative probability of the programmed state resistance of programmable elements according to another embodiment of the present invention.

Referring to FIG. 2, the abscissa of the graph represents the programmed state resistance (kilo-ohm) of programmable elements in logarithmic scale while the ordinate represents the percentage in logarithmic scale of the programmable elements whose programmed state resistance is below a given resistance. A first probability curve 22 shows the programmed state resistance of a programmable element having only one anti-fuse according to the prior art. A second probability curve 24 shows the programmed state resistance of a programmable element having five anti-fuses connected in parallel with each other. A third probability curve 26 shows the programmed state resistance of a programmable element having 10 anti-fuses connected in parallel with each other. Each anti-fuse consists of a pair of phosphorus doped polysilicon conductive plates (500 angstrom and 1000 angstrom, respectively) and silicon nitride dielectric layer (80 angstrom) therebetween. The programmable elements are programmed with a 9 volt 1 millisecond pulse through a 1 kilo-ohm resistor connected in series with the programmable elements.

As can be seen from all three curves 22–26, approximately 60% of the programmable elements have a programmed state resistance of lower than 2 kilo-ohms. Conversely, approximately 40% of the programmable elements have a programmed state resistance of higher than 2 kilo-ohms. The probability curve 22 according to the prior art shows that more than 5% of the conventional programmable elements have a resistance which is higher than approximately 30 kilo-ohms. For many applications, a programmed state resistance of 30 kilo-ohms or higher may be unacceptable and may lead to circuit failure. By contrast, the probability curves 24 and 26 according to the present invention have a much tighter distribution of the programmed state resistance. For example, the probability curve 24 shows that every programmable element having five parallel anti-fuses has a programmed state resistance of less than approximately 20 kilo-ohms. The probability curve 26 shows that an even better result is obtained with programmable elements having 10 parallel anti-fuses. The curve 26 shows that every programmable element has a resistance of less than 4 kilo-ohms. While there is no limit as to how many anti-fuses may be connected in parallel, the programmable element of the present invention preferably has 4 to 16 anti-fuses connected in parallel. The number of anti-fuses that are selected for use in the inventive programmable element will depend upon the desired value of the resistance of the programmable element in its programmed state.

Figure 3:
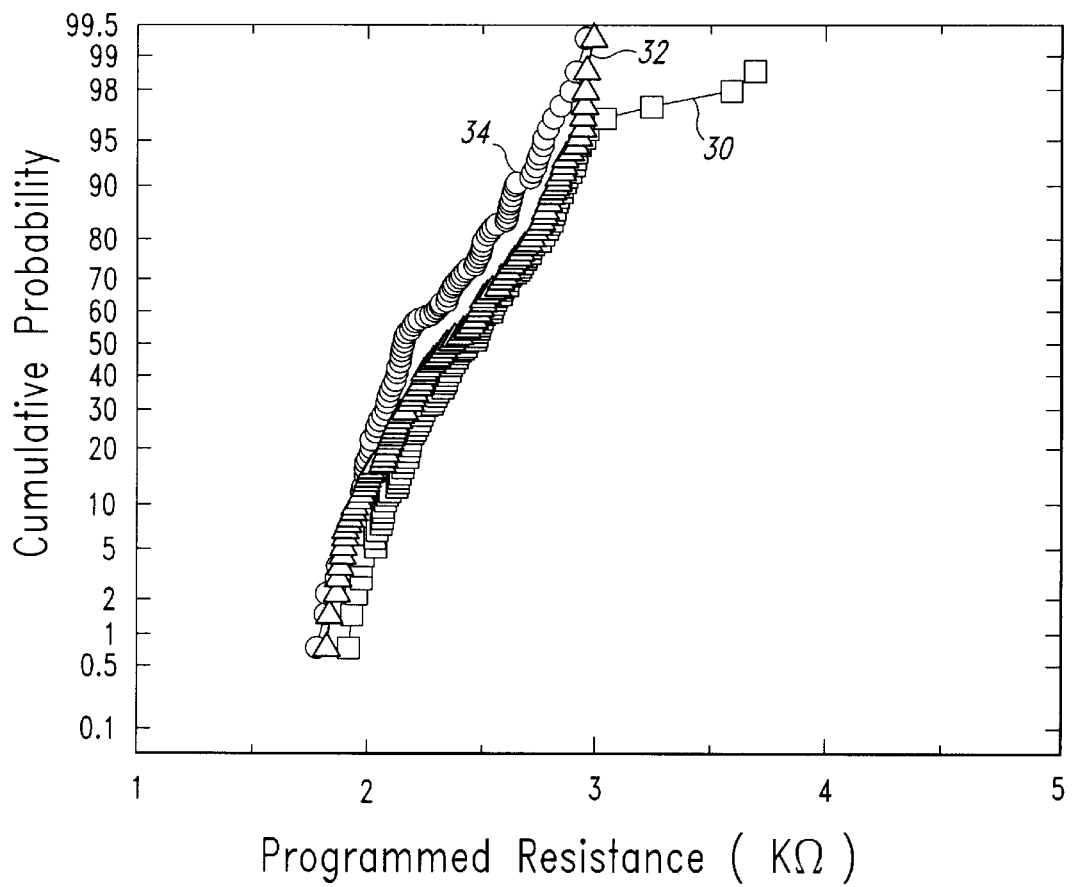
FIG. 3 is a graph illustrating the cumulative probability of the programmed state resistance of programmable elements according to another embodiment of the present invention.

FIG. 3 is similar to FIG. 2 and illustrates the cumulative probability of the programmed state resistance of programmable elements in which each anti-fuse is made of Arsenic doped polysilicon conductive plates. The probability curves 30, 32, and 34 show the programmed state resistance of programmable elements having one anti-fuse according to the prior art, five parallel anti-fuses, and 10 parallel anti-fuses, respectively. The programmable elements are programmed with a 9 volt 1 millisecond pulse through a 1 kilo-ohm resistor connected in series with the programmable elements.

As can be seen in FIG. 3, the probability curve 30 according to the prior art shows that more than 5% of the conventional programmable elements have a resistance of higher than 3 kilo-ohms. By contrast, the probability curves 32 and 34 according to the present invention have a much tighter distribution of the programmed state resistance. Specifically, the probability curves 32 and 34 show that every programmable element having five or ten parallel anti-fuses has a programmed state resistance of less than 3 kilo-ohms.

Figure 4A:
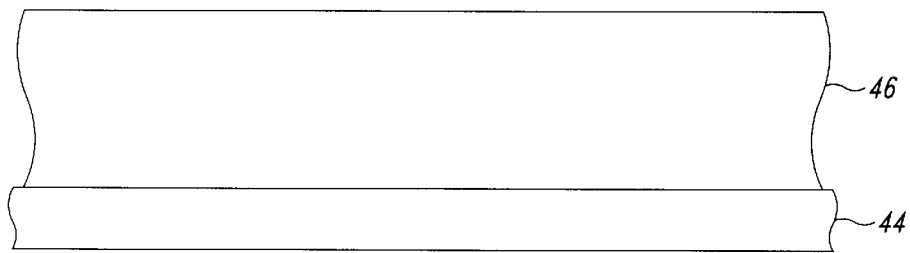
FIGS. 4A–4J are cross-sectional views illustrating various steps in forming the one-time programmable element of the present invention.
Figure 4B:
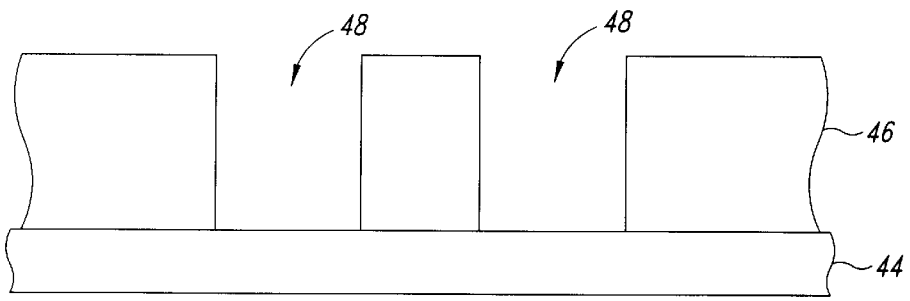
Figure 4C:
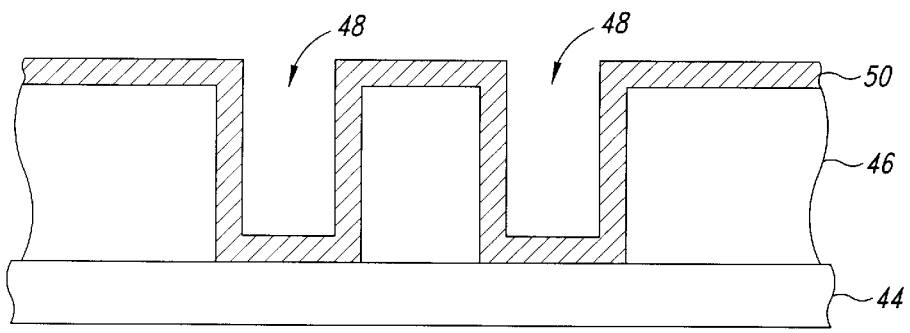

FIGS. 4A–4J illustrate various steps in forming the one-time programmable element according to one embodiment of the present invention. FIG. 4A shows the initial stack of a polysilicon layer 44, and insulating layer 46. The polysilicon layer 44 is preferably doped with an N-type impurity such as Phosphor or Arsenic to improve its conductivity. As shown in FIG. 4B, the insulating layer 46 is selectively etched using a mask (not shown) to form openings 48 and expose selected regions of the polysilicon layer 44. Preferably, a vertical anisotropic etch is used so that the sidewalls of the openings 48 have a substantially vertical profile. Typically, the openings 48 have a high height to width aspect ratio of 3:1 to 5:1. As shown in FIG. 4C, a conductive layer 50 is conformably deposited in a conventional manner. The conductive layer 50 covers the sidewalls of the openings 48, the exposed regions of the polysilicon layer 44 and the upper surface of the insulating layer 46.

Figure 4D:
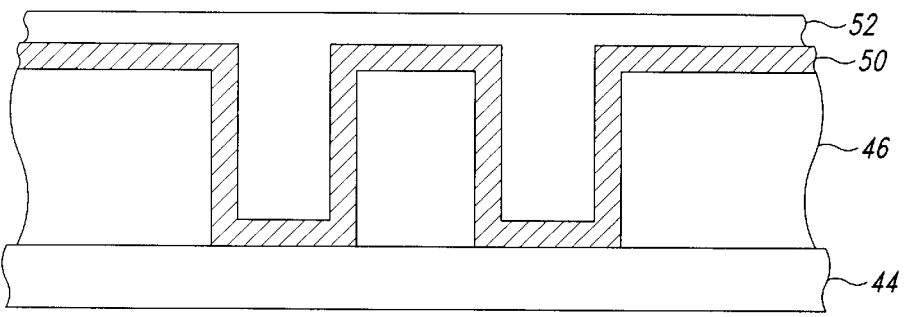
Figure 4E:
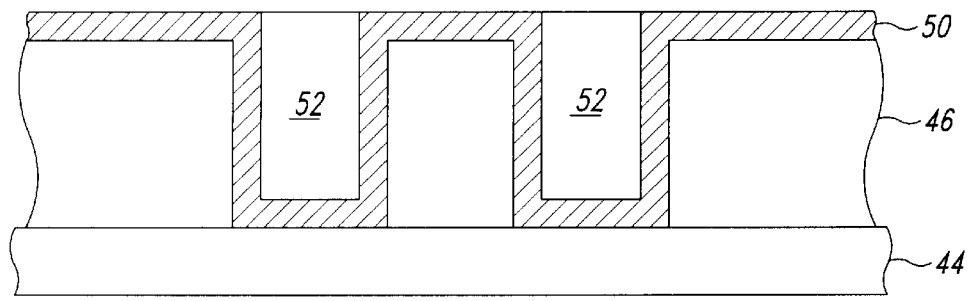
Figure 4F:
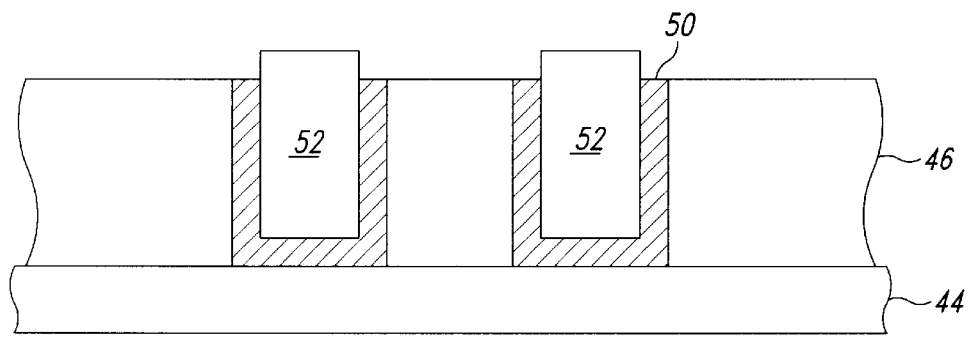
Figure 4G:
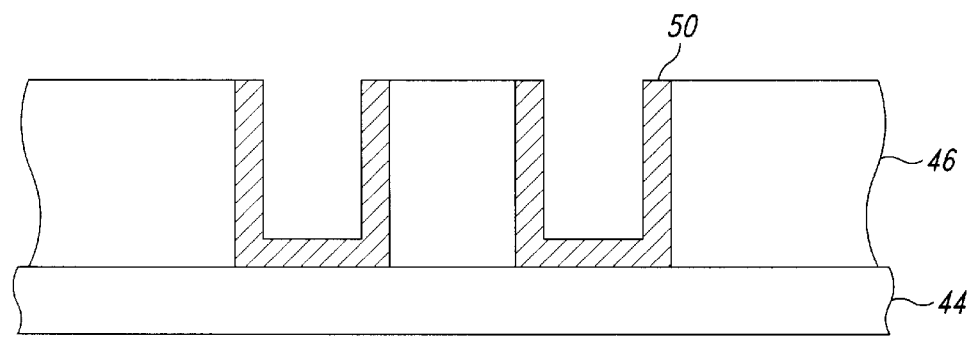

The conductive layer 50 overlying the insulating layer 46 is then etched back. One method of etch is an anisotropic etch without a mask. Since the openings 48 have a high aspect ratio, the deposited conductive layer 50 inside the openings are generally not etched. In an alternative method as shown in FIGS. 4D–4G, photoresist 52 is initially deposited over the conductive layer 50 and fills the openings 48 (FIG. 4D). As shown in FIG. 4E, the photoresist 52 overlying the insulating layer 46 is etched back to expose the conductive layer 50 while the photoresist inside the openings 48 remains intact. As shown in FIG. 4F, the exposed conductive layer 50 overlying the insulating layer 46 is then etched back. During this etch back process, the photoresist 52 protects the conductive layer 50 inside the openings 48. Once the conductive layer 50 overlying the insulating layer 46 is fully etched, the photoresist 52 inside the openings 48 is removed as shown in FIG. 4G. Persons of ordinary skill in the art will appreciate that while the photoresist 52 is used to protect the conductive layer 50 within the openings 48, any other material that is selectively etchable with respect to the conductive layer 50 may be used instead.

Figure 4H:
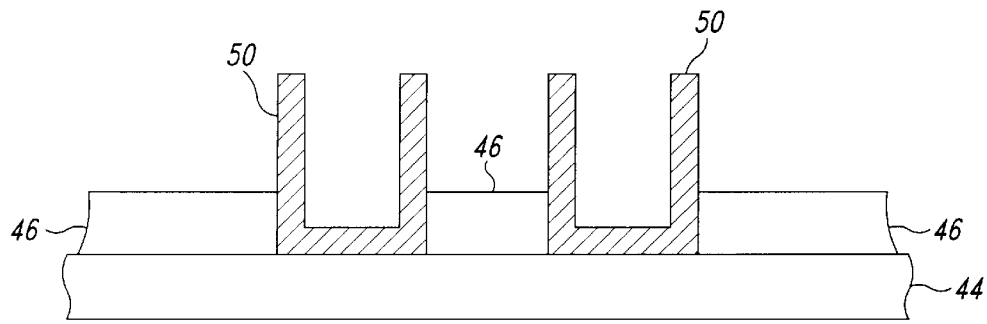
Figure 4I:
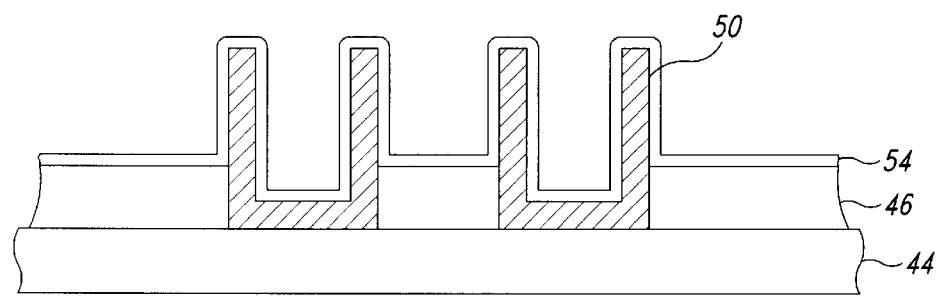
Figure 4J:
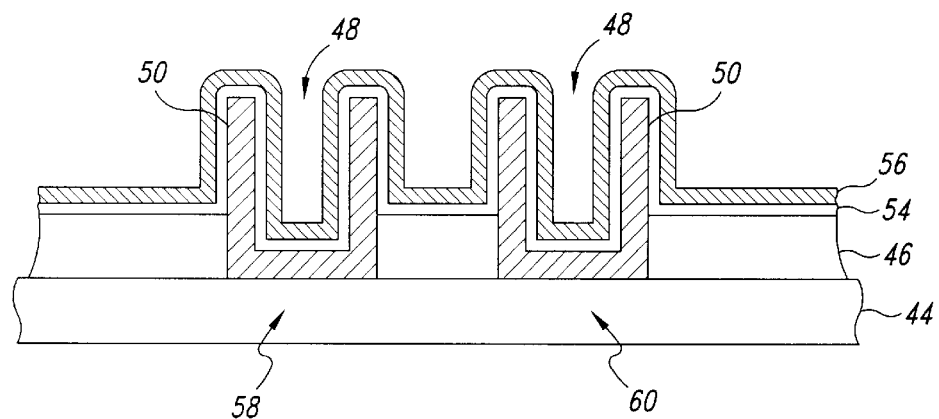

In FIG. 4H, the insulating layer 46 may be optionally etched down to a desired depth. Persons of ordinary skill in the art will recognize that while the insulating layer 46 provides structural support for the programmable elements being formed, removal of the insulating layer 46 provides more surface area of the dielectric layer of the programmable elements. Preferably, the insulating layer 46 is etched all the way down to the polysilicon layer 44. In some cases, however, this may not be possible due to the structural problem it may cause. The issue of whether and how much to remove the insulating layer 46 is a matter of design choice that depends on many factors including the types of conductive and insulating layers being used and the type of application of the programmable elements. As shown in FIG. 4I, a dielectric layer 54 is conformally deposited over the conductive layer 50 and the remaining portion of the insulating layer 46. Subsequently, a second conductive layer 56 is conformably deposited over the dielectric layer 54 as shown in FIG. 4J. The one-time programmable element according to the present invention comprises two anti-fuses 58 and 60 connected in parallel with each other. The conductive layer 50 and the second conductive layer 56 within each opening 48 form a pair of conductive plates of each anti-fuse which are separated by the dielectric layer 54. As can be seen in FIG. 4J, partial removal of the insulating layer 46 exposes the outer wall of the conductive layer 50 to the dielectric layer 54 to provide more dielectric surface area to the programmable element.

Figure 5A:
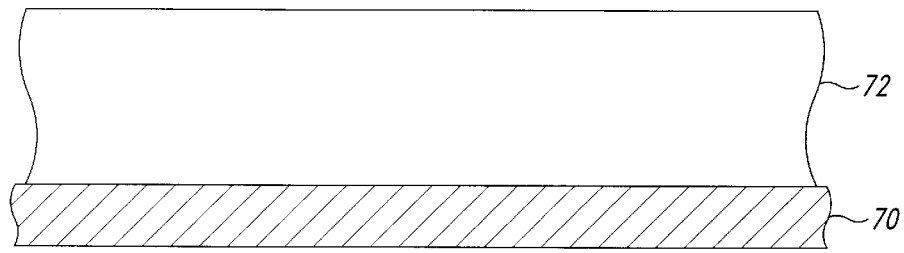
FIGS. 5A–5D are cross-sectional views illustrating various steps in forming the one-time programmable element according to another embodiment of the present invention.
Figure 5B:
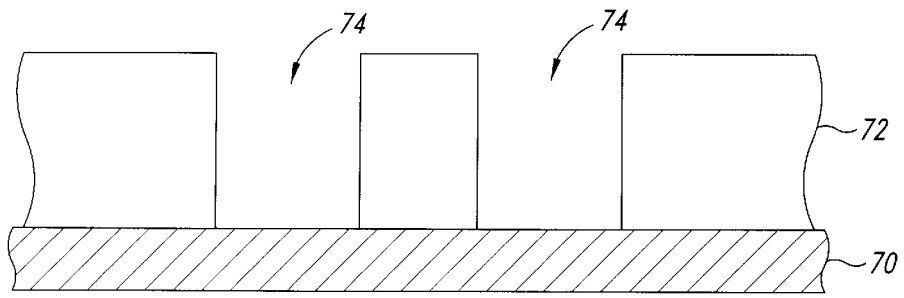
Figure 5C:
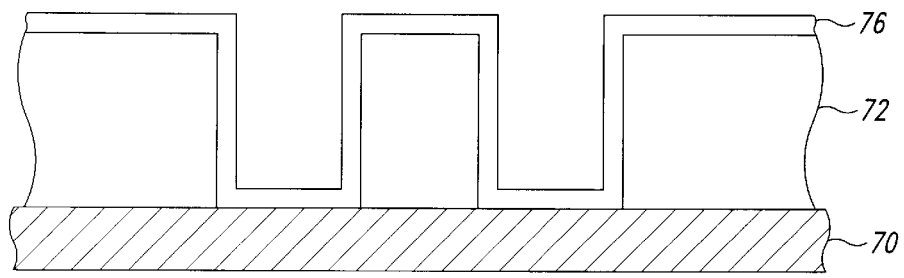
Figure 5D:
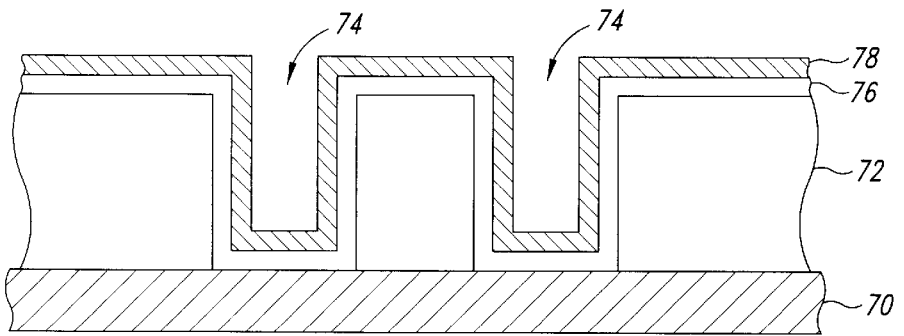

FIGS. 5A–5D illustrate various steps in forming the one-time programmable element in field programmable gate arrays. FIG. 5A shows the initial stack of a metal layer 70 and insulating layer 72 overlying the metal layer. The metal layer typically contains Aluminum, Tungsten, Copper, refractory silicides and refractory metals. However, any other types of metal may be used instead. As shown in FIG. 5B, the insulating layer 72 is selectively etched using a mask (not shown) to form openings 74 and expose selected regions of the metal layer 70. A vertical anisotropic etch is preferably used. As shown in FIG. 5C, a thin dielectric layer 76 such as silicon nitride layer is conformably deposited. Preferably, a plasma enhanced CVD is used in order to prevent the metal layer 70 from melting during the deposition process. The thin dielectric layer 76 covers the sidewalls of the openings 74, the exposed regions of the metal layer 70 and the upper surface of the insulating layer 72. As shown in FIG. 5D, a conductive layer 78 is conformally deposited over the thin dielectric layer 76. Again, a plasma enhanced CVD is preferably used. The one-time programmable element of the present invention comprises two anti-fuses 80 and 82 connected in parallel with each other. The conductive layer 78 within each opening 74 and the metal layer 70 form a pair of conductive plates of each anti-fuse which are separated by the dielectric layer 76.

Figure 6:
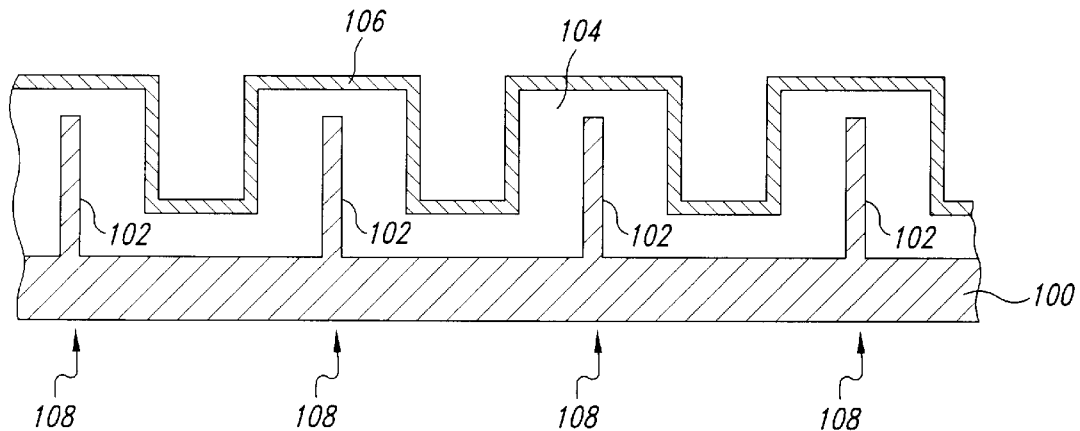
FIG. 6 is a cross-sectional view of an alternative embodiment of the inventive one-time programmable element.

FIG. 6 shows an alternative embodiment of the parallel connected anti-fuses which is somewhat similar to the embodiment of FIG. 5. As shown in FIG. 6, a conductive layer 100 includes a plurality of conductive plates 102 projecting perpendicularly from the conductive layer 100. The conductive layer 100 and plates 102 are conformably coated with a dielectric layer 104. Finally, the dielectric layer 104 is coated with a conductive layer 106 that forms the other plates of a plurality of anti-fuses 108.

Figure 7:
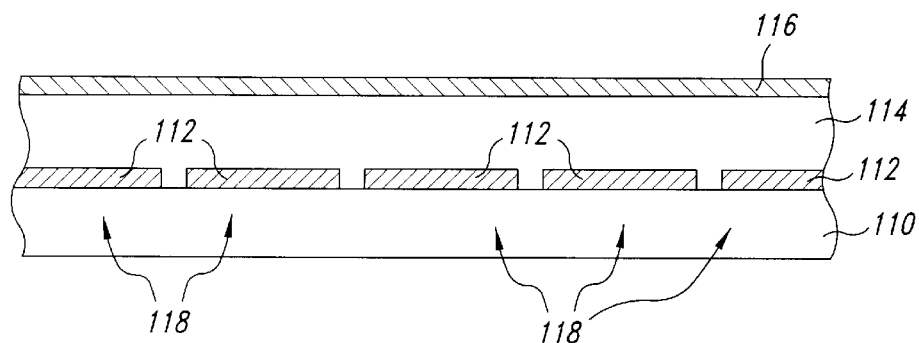
FIG. 7 is a cross-sectional view of still another embodiment of the inventive one-time programmable element.

Still another embodiment of the parallel connected anti-fuses is illustrated in FIG. 7. A layer of polysilicon material 110 is coated with a plurality of spaced-apart areas of a conductive layer 112. The conductive layer 112 is coated with a dielectric layer 114 which is, in turn, coated with a conductive layer 116. The conductive layer 116 forms a common plate of a plurality of anti-fuses 118 corresponding to each area of the conductive layer 112. The spaced-apart areas of the conductive layer 112 are interconnected through the polysilicon material 110.

Figure 8:
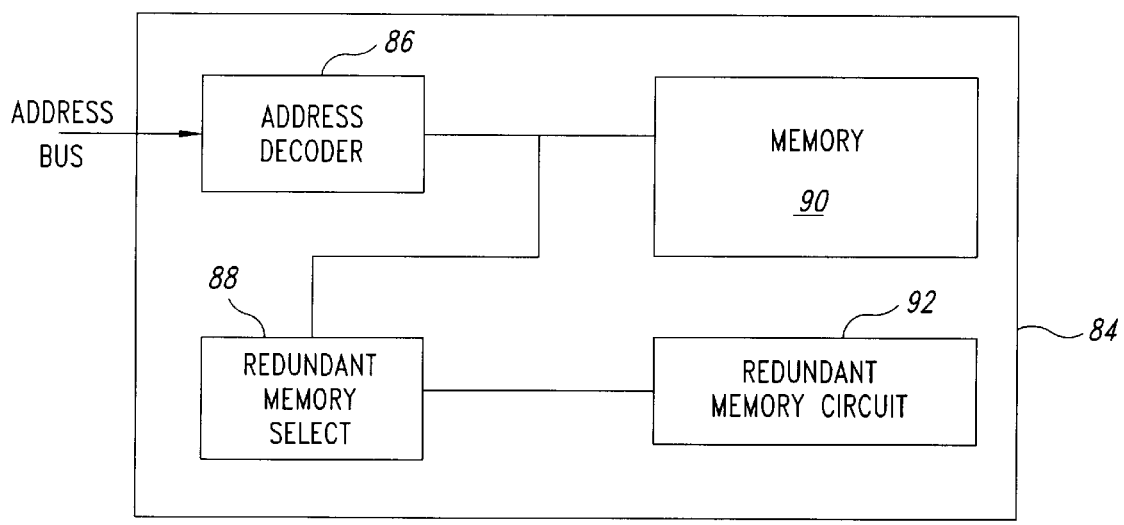
FIG. 8 is a block diagram of a portion of a memory device including the one-time programmable element of FIG. 1.

FIG. 8 is a block diagram of a memory device including the one-time programmable element of FIG. 1. The memory device includes an address decoder 86, redundant memory select circuit 88 that includes at least one programmable element according to the invention, memory 90 that includes a plurality of memory circuits, and redundant memory circuit 92. The redundant memory select circuit 88 and the memory 90 are connected to the address decoder 86. The redundant memory circuit 92 is connected to the redundant memory select circuit 88.

In operation, an external circuit (not shown) provides an address on the ADDRESS bus to the address decoder 86 during a read or write cycle. Based on the address, the address decoder 86 selects one of the memory circuits in the memory 90. The redundant memory select circuit 88 detects whether or not the selected memory circuit is defective based on the program states of the one-time programmable elements (not shown) in the redundant memory select circuit. If the selected memory circuit is defective, the redundant memory select circuit 88 selects the redundant memory circuit in order to read or write data.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A one-time non-conductive programmable element formed in an integrated circuit structure and programmable to a controlled programmed state resistance to conduct current therethrough, comprising:
   a plurality of anti-fuses corresponding in number to the desired programmed state resistance of said programmable element, each anti-fuse including:
      a first conductive layer;
      a second conductive layer; and
      a dielectric layer disposed between the first and the second conductive layers, the first conductive layers of the plurality of anti-fuses being connected to each other and the second conductive layer of the plurality of anti-fuses being connected to each other, wherein each anti-fuse is formed by a plurality of generally U-shaped first plates positioned adjacent, and interconnected, to each other, a layer of insulation covering said first plates, and a layer of conductive material covering said insulation to form a plurality of interconnected, generally U-shaped second plates that are surrounded by respective first plates whereby said first and second plates form the plurality of anti-fuses connected in parallel with each other.

2. The one-time programmable element according to claim 1 wherein the number of the plurality of anti-fuses ranges between 4 and 16.

3. The one-time programmable element according to claim 1 wherein the first or second conductive layer is an N+ diffusion layer.

4. The one-time programmable element according to claim 1 wherein the dielectric layer contains an oxide, nitride, nitride-oxide, oxide-nitride-oxide, or undoped amorphous silicon.

5. A one-time non-conductive programmable element formed in an integrated circuit structure and programmable to a controlled programmed state resistance to conduct current therethrough, comprising:
   a plurality of anti-fuses corresponding in number to the desired programmed state resistance of said programmable element, each anti-fuse including:
      a first conductive layer;
      a second conductive layer; and
      a dielectric layer disposed between the first and second conductive layers, the first conductive layers of the plurality of anti-fuses being connected to each other and the second conductive layers of the plurality of anti-fuses being connected to each other, whereby the plurality of anti-fuses are connected in parallel with each other and wherein the first or second conductive layer is an N+ diffusion layer.

6. The one-time programmable element according to claim 5 wherein the dielectric layer contains an oxide, nitride, nitride-oxide, oxide-nitride-oxide, or undoped amorphous silicon.

7. The one-time programmable element according to claim 5 wherein each first conductive layer, the respective second conductive layer and the respective portion of the dielectric material disposed therebetween defines a capacitor.

8. A one-time non-conductive programmable element formed in an integrated circuit structure and programmable to a controlled programmed state resistance to conduct current therethrough, comprising:

a plurality of first conductive plates;

a plurality of second conductive plates, each second conductive plate facing a respective first conductive plate, the plurality of first conductive plates connected to each other and the plurality of second conductive plates connected to each other, the number of first and second conductive plates corresponding to the desired programmed state resistance of said programmable element; and a dielectric material having a plurality of portions with each portion being disposed between each first conductive plate and the respective second conductive plate, and wherein the plurality of first conductive plates is a contiguous conductive layer.

9. An anti-fuse formed in an integrated circuit structure and programmable to a controlled programmed state resistance to conduct current therethrough, comprising:

a conductive layer having a plurality of portions;

a plurality of conductive plates, each conductive plate facing a respective one of said plurality of portions of the conductive layer, the plurality of conductive plates being connected to each other, said conductive plates corresponding in number to a desired cumulative probability for the programmed state resistance of said programmable element; and a dielectric material disposed between each conductive plate and the respective portion of the conductive layer, wherein a portion of the dielectric material breaks down to create a conduction channel when a programming signal is applied between the conductive layer and the plurality of conductive plates.

10. The anti-fuse according to claim 9 wherein the plurality of conductive plates is a contiguous layer.

11. The anti-fuse according to claim 9 wherein the number of the plurality of conductive plates ranges between 4 and 16.

12. An integrated memory device, comprising:

a plurality of memory circuits;

an address decoder connected to the plurality of memory circuits and operable to select one memory circuit among the plurality of memory circuits;

a redundant memory select circuit connected to the address decoder and including at least one one-time programmable element, each programmable element including:

a plurality of anti-fuses, each anti-fuse including:

a first conductive layer;

a second conductive layer; and a dielectric layer disposed between the first and second conductive layers, wherein the first conductive layers of the plurality of anti-fuses are connected to each other and the second conductive layers of the plurality of anti-fuses are connected to each other, wherein each anti-fuse is formed by a plurality of generally U-shaped first plates positioned adjacent, and interconnected, to each other, a layer of insulation covering said first plates, and a layer of conductive material covering said insulation to form a plurality of interconnected, generally U-shaped second plates that are surrounded by respective first plates whereby the anti-fuses are coupled to each other in parallel; and a redundant memory circuit connected to the redundant memory select circuit, the redundant memory select circuit being operable to select the redundant memory circuit based on the program state of the programmable element.

13. A method of controlling the programmed state resistance of a one-time programmable element, comprising:

selecting a desired cumulative probability for the programmed state resistance of said programmable element;

placing a plurality of anti-fuses in parallel with each other, the number of said anti-fuses corresponding to the selected cumulative probability for the programmed state resistance of said programmable element.

* * * * *